United States Patent
Smith

(10) Patent No.: US 10,107,621 B2
(45) Date of Patent: Oct. 23, 2018

(54) IMAGE BASED OVERLAY MEASUREMENT WITH FINITE GRATINGS

(71) Applicant: Nanometrics Incorporated, Milpitas, CA (US)

(72) Inventor: Nigel P. Smith, Beaverton, OR (US)

(73) Assignee: Nanometrics Incorporated, Milpitas, CA (US)

( * ) Notice: Subject to any disclaimer, the term of this patent is extended or adjusted under 35 U.S.C. 154(b) by 152 days.

(21) Appl. No.: 13/766,598

(22) Filed: Feb. 13, 2013

(65) Prior Publication Data

US 2013/0208279 A1    Aug. 15, 2013

Related U.S. Application Data

(60) Provisional application No. 61/599,333, filed on Feb. 15, 2012.

(51) Int. Cl.
*G01B 11/14* (2006.01)
*G01B 11/26* (2006.01)
*G03F 7/20* (2006.01)

(52) U.S. Cl.
CPC .......... *G01B 11/26* (2013.01); *G03F 7/70633* (2013.01)

(58) Field of Classification Search
CPC ....... G01B 11/27; G01B 11/00; G01B 11/272; G03F 9/70; G03F 7/70358; G03F 7/70633; G03F 9/7076; G03F 9/7088; G03F 9/7049
USPC .................................. 356/399–401
See application file for complete search history.

(56) References Cited

U.S. PATENT DOCUMENTS

| | | | |
|---|---|---|---|
| 7,616,313 B2 * | 11/2009 | Kandel et al. | 356/401 |
| 7,911,612 B2 * | 3/2011 | Kiers et al. | 356/399 |
| 2005/0012928 A1 * | 1/2005 | Sezginer et al. | 356/401 |
| 2005/0018190 A1 * | 1/2005 | Sezginer et al. | 356/401 |

(Continued)

FOREIGN PATENT DOCUMENTS

| | | |
|---|---|---|
| TW | 200949190 A | 12/2009 |
| TW | 200952037 A | 12/2009 |
| TW | 201011277 A1 | 3/2010 |

OTHER PUBLICATIONS

Ku, Y.S. et al. "In-chip overlay metrology for 45nm processes," *Proc. SPIE* 6617:66170X-1-12 (2007).

(Continued)

*Primary Examiner* — Isiaka Akanbi
(74) *Attorney, Agent, or Firm* — Silicon Valley Patent Group LLP

(57) ABSTRACT

An image based overlay measurement is performed using an overlay target that includes shifted overlying gratings. The overlay target is imaged and an asymmetry is measured in the image of the overlaid gratings. The asymmetry is used to determine the overlay error. For each measurement direction, the overlay target may include two or more overlay measurement pads with different offsets between the top and bottom gratings. The measured asymmetries and offsets in the overlay measurement pads may be used to determine the overlay error, e.g., using self-calibration. The pitch and critical dimensions of the overlay target may be optimized to produce a greatest change of symmetry with overlay error for a numerical aperture and wavelength of light used by the image based metrology device.

39 Claims, 6 Drawing Sheets

(56) References Cited

U.S. PATENT DOCUMENTS

| | | | |
|---|---|---|---|
| 2005/0195398 A1* | 9/2005 | Adel | B82Y 10/00 356/401 |
| 2006/0066855 A1* | 3/2006 | Boef et al. | 356/401 |
| 2009/0087756 A1 | 4/2009 | Schulz | |
| 2009/0116014 A1 | 5/2009 | Smith et al. | |
| 2009/0296075 A1 | 12/2009 | Hu et al. | |
| 2011/0320986 A1 | 12/2011 | Hsu et al. | |

OTHER PUBLICATIONS

International Search Report and Written Opinion dated Jun. 26, 2013 for PCT Application No. PCT/US2013/026197 filed on Feb. 14, 2013, 13 pages.

Smith et al. "Minimising optical overlay measurement errors," *Proc. SPIE* 1926:450-462 (1993).

Smith et al. "Size matters in overlay measurement," *Proc. SPIE* 8324: 832418-1-832418-12 (2012).

Machine translation in English of Abstract for TW 200949190 visited at www.espacenet.com on Apr. 8, 2015, 1 page.

\* cited by examiner

IMAGE BASED OVERLAY MEASUREMENT WITH FINITE GRATINGS

CLAIM OF PRIORITY UNDER 35 U.S.C. § 119

This application claims under 35 USC § 119 the benefit of and priority to U.S. Provisional Application No. 61/599,333, filed Feb. 15, 2012, which is incorporated by reference herein in its entirety.

BACKGROUND

Background Field

Embodiments of the subject matter described herein are related generally to overlay measurement, and more particularly to image based overlay measurement.

Relevant Background

Semiconductor processing for forming integrated circuits requires a series of processing steps. These processing steps include the deposition and patterning of material layers such as insulating layers, polysilicon layers, and metal layers. The material layers are typically patterned using a photoresist layer that is patterned over the material layer using a photomask or reticle. Typically, the photomask has alignment targets or keys that are aligned to fiduciary marks formed in the previous layer on the substrate. However, as the size of integrated circuit features continues to decrease, it becomes increasingly difficult to measure the overlay accuracy of one masking level to the previous level. This overlay metrology problem becomes particularly difficult at submicrometer feature sizes where overlay alignment tolerances are reduced to provide reliable semiconductor devices.

Overlay measurement may be performed optically, e.g., based on an image of specially designed overlay targets or using light that is diffracted from the overlay targets. Image Based Overlay (IBO) measurements are performed using targets, such as box-in-box or bar-in-bar targets, that are imaged and the distance between target features printed on different layers is measured. Conventional IBO measurement targets are typically 20×20 µm or 25×25 µm in size. Diffracted-Based Overlay (DBO) typically uses targets having gratings that are not perfectly aligned, where a resulting diffraction pattern is used to determine the overlay error. Newer DBO targets may be 10×10 µm or larger.

There is increasing need for small overlay targets. Typically overlay targets are placed in the scribe lines between chips. Scribe lines, however, are shrinking to 50 µm, making targets of 20×20 µm or less desirable to end users who prefer to place targets side by side across the scribe line. The increase in the number of printed layers also creates pressure for targets to become smaller, as with the increase of layers, the number of targets also increases. Additionally, the newest processes benefit from more detailed knowledge of intrafield overlay variation, which can best be obtained using overlay targets that are placed within the device area, i.e., in-chip. Many end users are maintaining 10×10 µm openings within non-memory areas of their products so overlay targets may be printed and measured within these spaces.

SUMMARY

An image based overlay measurement is performed using an overlay target that includes shifted overlying grating patterns. Each grating consists of two or more lines, e.g., with the same width and constant pitch. The two gratings may have the same pitch or different pitches. If the mid- points of the gratings are coincident then the image of the overall pattern will be symmetric, while any offset from center alignment, whether produced deliberately or as a result of layer to layer overlay error, causes the overall pattern and hence its image to be asymmetric. The overlay target is configured so that a lateral separation between the nearest lines in gratings from different layers is sufficiently close to an image resolution limit of the image based metrology device, that proximity effects improve sensitivity of the measured asymmetry to overlay shift. The overlay target is imaged and an asymmetry is measured in the image. The asymmetry is used to determine the overlay error. For each measurement direction, the overlay target may include one overlay measurement pad or two or more overlay measurement pads with different intentional offsets between the top and bottom gratings. The change in the measured asymmetries of the overlay measurement pads as a function of the designed offset may be used to produce a calibration of a symmetry response to overlay, which may then be applied to the measured asymmetries to determine the overlay error. The measured asymmetries and offsets in the overlay measurement pads may be used to determine the overlay error, e.g., using self-calibration. The pitch and critical dimensions of the overlay target may be optimized to produce a greatest change of symmetry with overlay error for a numerical aperture and wavelength of light used by the image based metrology device.

In one implementation, a method of measuring an overlay error in a structure having an overlay target, includes imaging the overlay target with an image based metrology device, the overlay target having a first top grating and a first bottom grating, wherein a nominal position of the first top grating with respect to the first bottom grating is the first top grating overlies the first bottom grating and is shifted with respect to the first bottom grating; measuring an asymmetry in an image of the overlay target; and using the asymmetry to determine the overlay error in the structure.

In one implementation, an image based metrology device includes an illumination source to produce illumination to be incident on an overlay target on a sample, the overlay target having a first top grating and a first bottom grating, wherein a nominal position of the first top grating with respect to the first bottom grating is the first top grating overlies the first bottom grating and is shifted with respect to the first bottom grating; an imaging system to image the overlay target; and a processor coupled to receive the image of the overlay target from the imaging system, the processor configured to measure an asymmetry in the image of the overlay target, and use the asymmetry to determine the overlay error in the sample.

In one implementation, a method of measuring an overlay error in a structure having an overlay target includes imaging the overlay target with an image based metrology device, the overlay target having a first overlay measurement pad having a first top grating that overlies a first bottom grating, wherein the first top grating is nominally shifted with respect to the first bottom grating by a first offset, the overlay target further having a second overlay measurement pad having a second top grating that overlies a second bottom grating, wherein the second top grating is nominally shifted with respect to the second bottom grating by a second offset that is different than the first offset; measuring a first asymmetry in the first overlay measurement pad from an image of the overlay target; measuring a second asymmetry in the second overlay measurement pad from the image of the overlay target; and using the first asymmetry, the first offset, the second asymmetry, and the second offset to determine the overlay error in the structure.

DETAILED DESCRIPTION

Figure 1:
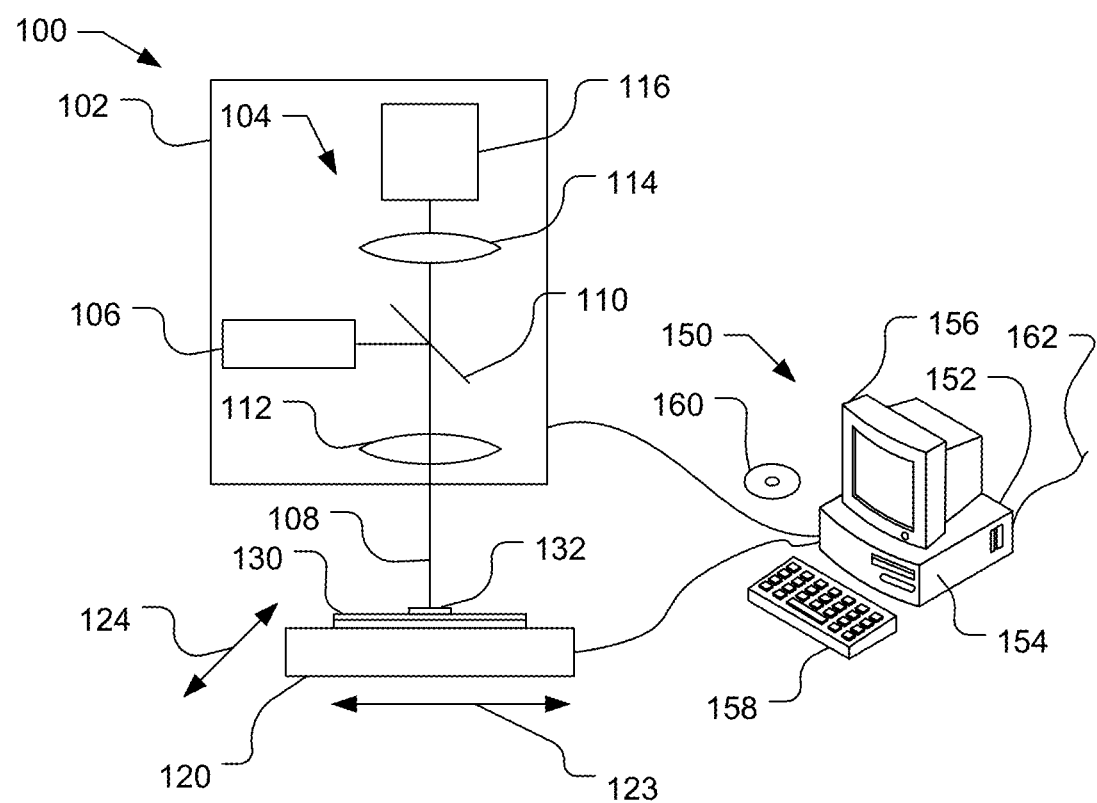
FIG. 1 shows a schematic view of an image based metrology device that may be used to measure overlay errors on a sample by imaging an overlay target that includes shifted overlying gratings.

FIG. 1 shows a schematic view of an image based metrology device 100 that may be used to measure overlay errors on a sample 130 by imaging an overlay target 132 that includes shifted overlying gratings. Metrology device 100 includes an optical head 102 that is coupled to a computer 150, such as a workstation, a personal computer, central processing unit or other adequate computer system, or multiple systems. If desired, multiple optical heads, i.e., different metrology devices, may be combined in the same metrology device 100. The computer 150 may control the movement of a stage 120 that holds the sample 130 and/or the optical head 102. The stage 120 may be capable of horizontal motion in either Cartesian (i.e., X and Y) coordinates, as indicated by arrows 123 and 124, or Polar (i.e., R and θ) coordinates or some combination of the two. The stage may also be capable of vertical motion.

The optical head 102 includes an imaging system 104 that includes an infra-red, visible or ultra-violet (UV) reflected-light microscope including, an infra-red, a visible and/or UV light source 106, such as a Xenon Arc lamp and/or a Deuterium lamp, and/or light emitting diode(s) (LED), and a detector 116, such as a CCD array. In operation, light produced by the light source 106 may be directed toward the sample 130, along optical axis 108 with a beam splitter 110. An objective 112 focuses the light onto the sample 130 and received reflected light from the sample 130. The reflective light may pass through the beam splitter 110 and is focused with lens 114 onto the detector 116. The detector 116 generates a signal representing an image of the overlay target 132. The objective 112, beam splitter 110, lens 114, and detector 116 are merely illustrative of typical optical elements. Generally, additional optical elements are required to achieve the desired field of view and magnification of a suitable imaging system 104. In one embodiment, imaging system 104 may be a confocal microscope. In another embodiment, imaging system 104 may include interferometric components such as a Michelson or Mirau objective, or a Linnik arrangement.

The signal representing the image of the overlay target 132 is provided to a computer 150 that is preferably included in, or is connected to or otherwise associated with optical head 102 for processing the data collected by the optical head 102. The computer 150 collects and analyzes the data from the optical head 102 to determine an overlay error based on an image of the overlay target 132. The computer 150, which includes a processor 152 with memory 154, as well as a user interface including e.g., a display 156 and input devices 158. A non-transitory computer-usable storage medium 160 having computer-readable program code embodied may be used by the computer 150 for causing the processor to control the metrology device 100 and to perform the functions including the analysis described herein. The data structures and software code for automatically implementing one or more acts described in this detailed description can be implemented by one of ordinary skill in the art in light of the present disclosure and stored, e.g., on a computer readable storage medium 160, which may be any device or medium that can store code and/or data for use by a computer system such as processor 152. The computer-usable storage medium 160 may be, but is not limited to, magnetic and optical storage devices such as disk drives, magnetic tape, compact discs, and DVDs (digital versatile discs or digital video discs). A communication port 162 may also be used to receive instructions that are stored in memory 154 or other storage in computer 150 and used to program the computer 150 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

Figure 2:
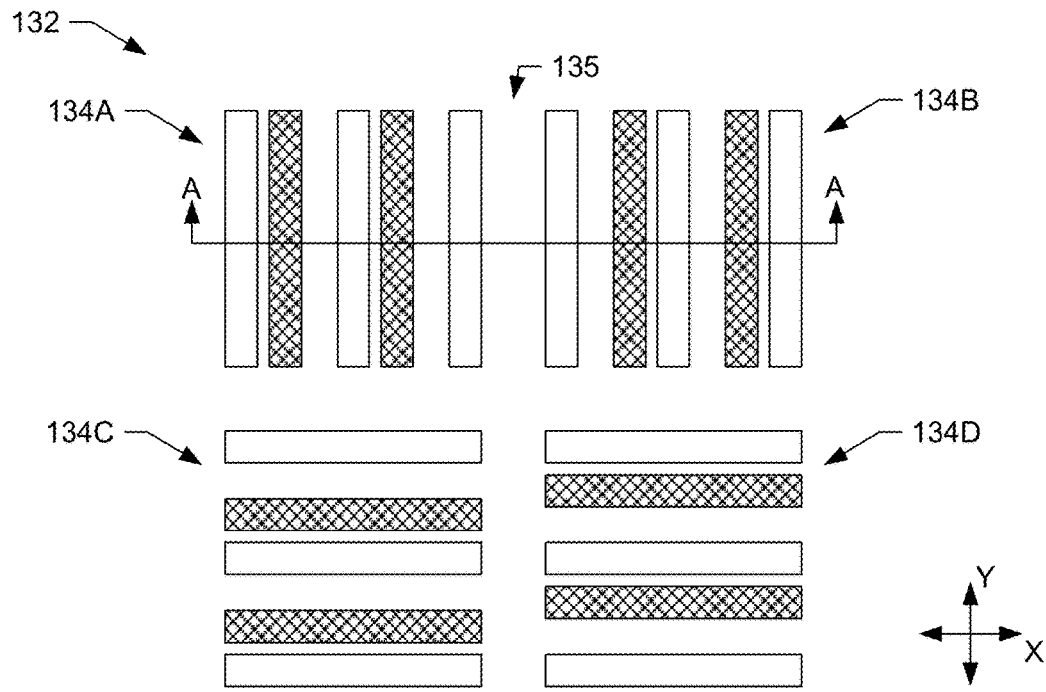
FIG. 2 is a top view of an overlay target that includes a plurality of overlay measurement pads having overlying gratings that include a programmed offset.
Figure 10:
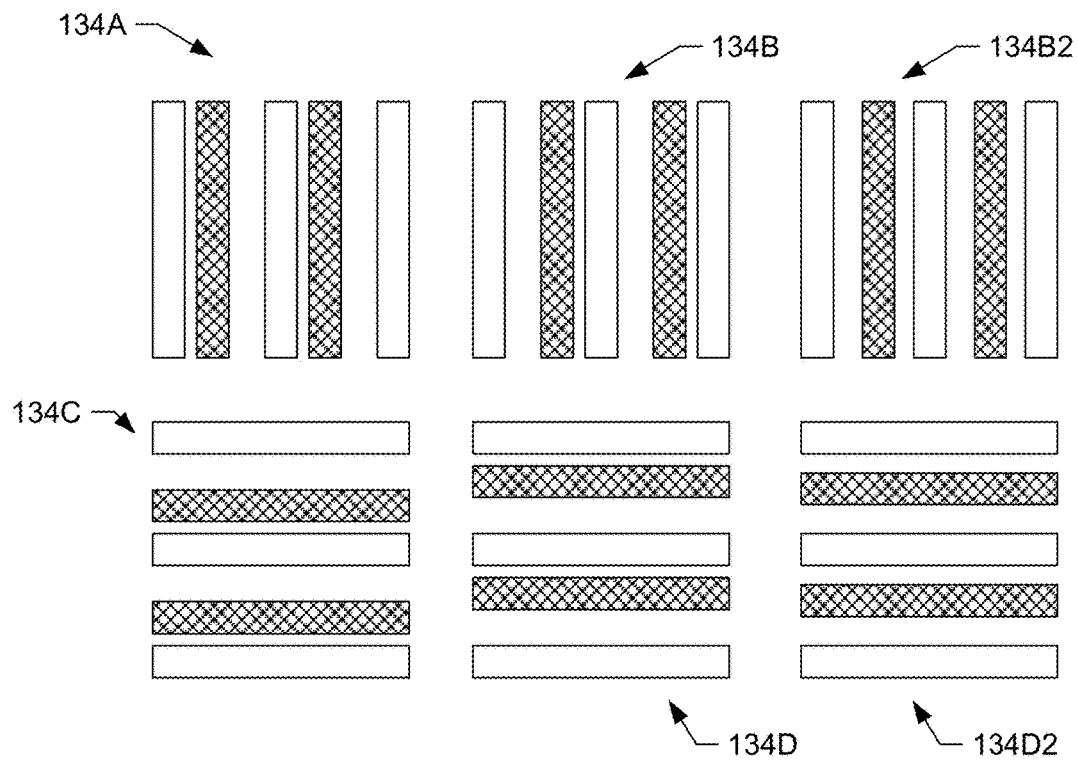
FIG. 10 illustrates another embodiment of an overlay target including three overlay pads per measurement direction.
Figure 11:
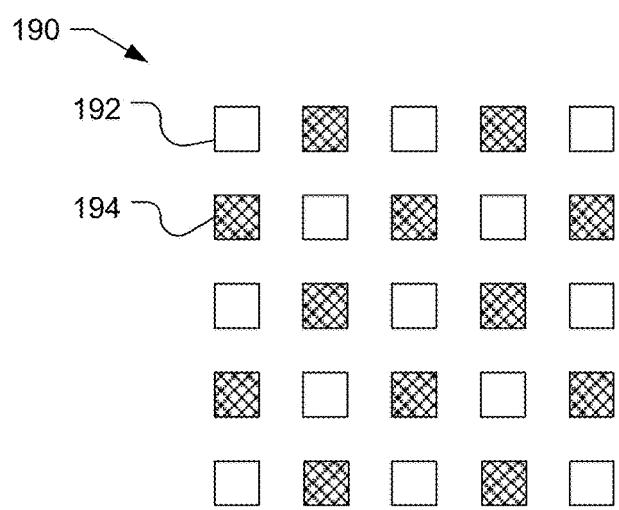
FIG. 11 illustrates another embodiment showing one measurement pad patterned in two dimensions.

FIG. 2 is a top view of the overlay target 132, which as illustrated includes a plurality of overlay measurement pads 134A, 134B, 134C and 134D (sometimes collectively referred to as overlay measurement pads 134), each of which includes a number of overlying gratings that include a programmed offset, i.e., the gratings are intentionally shifted by a known amount so that they are not aligned in their nominal position. An image of the overlay measurement pads 134A and 134B may be used to determine an overlay error in the X direction, while an image of the overlay measurement pads may be used to determine an overlay error in the Y direction. One or more of the overlay measurement pads 134 may be imaged simultaneously with the image based metrology device 100. Of course, imaging the entire overlay target 132 at once is useful to improve throughput, but if desired each pad may be imaged at a different time. It should be understood that FIG. 2 illustrates one possible arrangement of the overlay measurement pads 134 and that other arrangements may be used if desired. For example, if desired, the overlay target 132 may include only a single overlay measurement pad per measurement direction (e.g., overlay measurement pad 134A and 134C) or more than two overlay measurement pads in each of the measurement directions, as illustrated in FIG. 10 discussed below. Additionally, the overlay target may have a different configuration than that shown in FIG. 2, e.g., as illustrated in FIG. 11 discussed below. Moreover, there is no requirement or restriction with respect to the layout symmetry.

Figure 3:
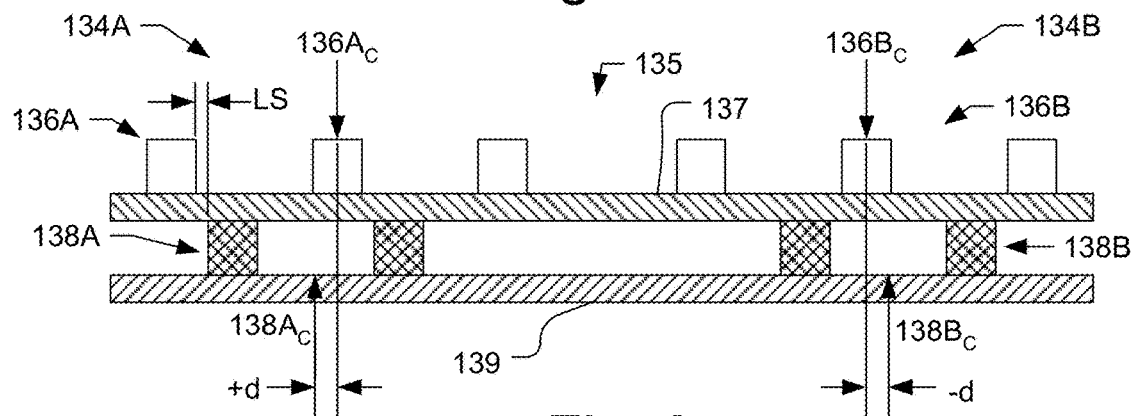
FIG. 3 illustrates a cross-sectional view of a portion of the overlay target shown in FIG. 2.
Figure 4:
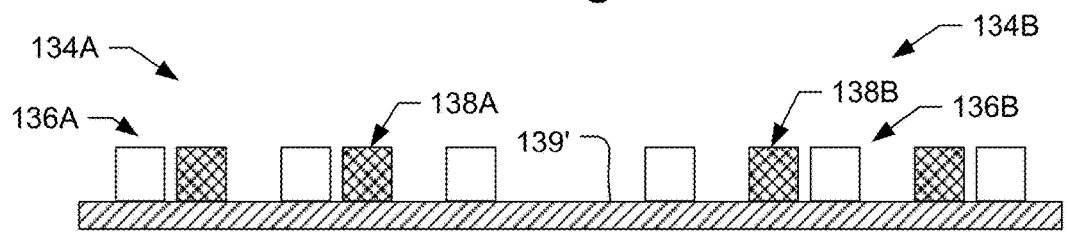
FIG. 4 illustrates another embodiment of the cross-sectional view of a portion of the overlay target shown in FIG. 2, with the top grating and the bottom grating in the same plane.

FIG. 3, by way of example, illustrates a cross-sectional view of a portion of the overlay target 132, specifically, overlay measurement pads 134A and 134B, along lines AA in FIG. 2. It should be understood that overlay measurements pads 134C and 1324D are similar to overlay measurement pads 134A and 134B but are orthogonally rotated with respect to the overlay measurement pads 134A and 134B. As can be seen, each overlay measurement pad 134A and 134B includes a top grating 136A, 136B (sometimes collectively referred to as the top grating 136) and a bottom grating 138A, 138B (sometimes collectively referred to as the bottom grating 138). The top gratings 136 and the bottom gratings 138 are illustrated as being on different layers 137 and 139 of the sample, but they may be on the same plane 139' as illustrated in FIG. 4. It should be noted that in cases where the gratings are on the sample plane 139', e.g., double patterning, the two gratings are notionally in the surface film but may be printed at different times. As used herein, a "layer" may be a pattern produced in one lithographic step and thus, in FIG. 4, gratings 136 and 138 may be said to be on different layers, albeit on the same plane 139'. The top grating 136 is illustrated as including three lines, while bottom grating 138 is illustrated as including only two lines. If desired, additional lines may be used and the top grating 136 may have fewer lines than bottom grating 138. Moreover, it is noted that bottom grating 138 is illustrated as including only two parallel lines, which are defined herein as a grating.

Importantly, the overlay target 132 is configured so that with the gratings 136 and 138 overlaid, the lateral separation between the edges of the nearest lines from each layer, illustrated as lateral separation LS in FIG. 3, is small enough that the proximity of the lines will modify the image produced by the imaged based metrology device 100 due to the proximity effect. Close proximity of the nearest lines from different layers will advantageously modify the measured intensity distribution in the region around the lines thereby increasing the sensitivity of the target image asymmetry to overlay shift. The proximity effect decreases as the lateral separation between the lines increases. Notably, a standard image based overlay target, such as a conventional box-in-box target or bar-in-bar target, is designed so that the proximity effect between lines from different layers is negligible. As a rule of thumb, the limiting separation where the proximity effect is noticeable is approximately six times the optical resolution, which may be, e.g., 5 µm in a typical system. For reference, a discussion of designing conventional image based overlay targets to avoid proximity effects may be found, e.g., in Smith, N. P., Goelzer, G. R., Hanna, M., et al, "Minimizing optical overlay measurement errors", Proc. SPIE 1926, 450-462 (1993), which is incorporated herein by reference. Thus, the overlay target 132, including the offset, is designed based on the characteristics of the image based metrology device 100, e.g., the image resolution limit, to increase, e.g., optimize, the sensitivity of the target image asymmetry to overlay error in the range of expected overlay errors using the proximity effect, whereas conventional image based overlay targets are designed to avoid the proximity effect.

When there is no overlay error and no deliberate shift between the top gratings 136 and the bottom gratings 138, the centers of the top gratings 136 and of the bottom gratings 138, e.g., 136A$_C$ and 138A$_C$, would be coincident. If one of the top or bottom gratings has an even number of lines in each pad and the other grating an odd number of lines, and if the gratings are designed with the same pitch, then the grating lines of the top grating 136 are interleaved with the grating lines of the bottom grating 138 with a shift of half the pitch to align the centers 136A$_C$ and 138A$_C$ of the gratings in overlay measurement pad 134A and the centers 136B$_C$ and 138B$_C$ of the gratings in overlay measurement pad 134B. This is a convenient arrangement, although other arrangements, such as with the grating having the same number of lines that are nominally perfectly overlaid or having different pitches and/or line width, are also possible. For the purpose of providing a self-calibration ability the bottom gratings 138, and the top gratings 136 may be offset from a center alignment position with respect to the bottom gratings 138 by a known amount and direction. The offset from the center alignment position used with the first overlay measurement pad 134A, illustrated in FIG. 3 as +d, is different than the offset from the center alignment position used with the second overlay measurement pad 134B, illustrated as −d. Calibration assumes a predictable relationship between the response to overlay shift of the asymmetry in the image of each overlay measurement pad, and this is conveniently achieved by using the same pitch and line width settings for the gratings in the same layer in each overlay measurement pad.

The design of the overlay target 132 is configured to be imaged with the lines in the combined pattern formed by the overlaid top grating 136 and bottom grating 138 barely resolvable by the metrology tool 100. For example, assuming the highest possible numerical aperture (NA), e.g., approximately 0.9 in air, and short wavelength illumination, e.g., 400 nm, a microscope, such as the metrology tool 100, may just resolve features at a 400 nm pitch. Accordingly, each of the top grating 136 and the bottom grating 138 may have an 800 nm pitch and are interleaved, by shifting the gratings by approximately half a pitch, so that the centers of the gratings are approximately aligned to produce a pitch of 400 nm for the combined gratings. As illustrated, the top grating 136 overlies the bottom grating 138, but is offset from center alignment by a small amount, e.g., 5% of the pitch of each grating, in opposite directions in the overlay measurement pads 134A and 134B. Thus, the center of the top grating 136 is offset with respect to the center of the bottom grating 138 by a small offset (+d) in overlay measurement pad 134A and decreased by a small offset (−d) in the other overlay measurement pad 134B. The offsets used in the overlay measurement pads 134A and 134B may be equal in magnitude but opposite in direction so that the nominal positions of the measurement pads 134A and 134B, i.e., when no overlay error is present, are symmetrical. Alternatively, the offsets may have different magnitudes and/or different or the same directions.

Of course, other choices of grating pitch, critical dimensions, and offset may be chosen and will generally be optimized for the NA of the image system 104 and operating wavelength produced by the light source 106 used to measure the overlay target 132, and to optimize the sensitivity of the target image asymmetry to overlay error in the range of expected overlay errors, e.g., currently ±20 nm. For example, at a NA=0.5 and 550 nm center operating wavelength of a Mosaic series overlay tool produced by Nanometrics Incorporated, the smallest resolvable pitch is approximately 800 nm. Accordingly, each of the top grating 136 and the bottom grating 138 may have a 1600 nm pitch and are interleaved by a distance of approximately half the pitch (800 nm), with an additional offset ±d, creating an overlay measurement pad with gratings having an effective pitch that is just resolvable by the tool.

Using a net pitch of the overlaid gratings 136 and 138 that is above the resolution limit of the metrology device 100 ensures there is some modulation in the image of the overlay measurement pads 134 and increases the asymmetry signal. The sensitivity of the image asymmetry to pattern overlay decreases as the closest separation of the overlaid lines is increased, so it is desirable that the nominal positions of the gratings 136 and 138 are positioned so that the closest overlaid line separation LS to less than five times, e.g., four times, three times or less, the image resolution limit of the metrology device 100. The width of each line in the gratings 136 and 138 is selected to optimize the contrast of the modulations in the image of each overlay measurement pad 134. The width of the grating lines may be, e.g., 25% or less of the pitch of each grating, so that the lines fill no more than 50% of the image of the overlaid gratings. The line width may be chosen by experiment or image modeling such that the sensitivity of the measured image asymmetry to overlay shift is maximized. Additionally, a gap 135 is present between the four overlay measurement pads 134 as well as surrounding the overlay target 132 so that the image asymmetry of each pad is not modified by the presence or absence of any adjacent pattern. Since the gap 135 increases the size of the target without providing useful information, it is desirable to use a gap with the smallest acceptable width. The smallest possible gap surrounding the pads will depend on parameters used to determine asymmetry, the resolution (NA and wavelength) of the metrology device 100 and the desired accuracy of the measurement, but a gap 135 between and surrounding overlay measurement pads 134 that is approximately 1 μm may be a typical value. While a gap of 1 μm is less than the distance required to reduce proximity effects to negligible levels as stated above, similar distances are commonly used in other target designs deployed for production overlay control. A larger distance may be used if desired to improve measurement accuracy at the expense of increased total target size.

With these dimensions, each of the four overlay measurement pads 134 in FIG. 2 has three lines in one layer and two in the other, of length 4 μm and with two sides to each line, making the total pattern length perpendicular to the measurement direction in each pad 40 μm. With two pads per measurement direction, the total pattern length per measured axis is 80 μm. An advantage of the use of overlay target 132 in an image based overlay error measurement is the increased pattern length of the overlay target 132 relative to conventional image based overlay targets of the same size. Increasing measurement target pattern length has been found to improve measurement accuracy. See, N. Smith et al., "Size matters in overlay measurement", Proc. SPIE 8324, Metrology, Inspection, and Process Control for Microlithography XXVI, 832418 (Mar. 29, 2012), which is incorporated herein by reference.

Figure 5:
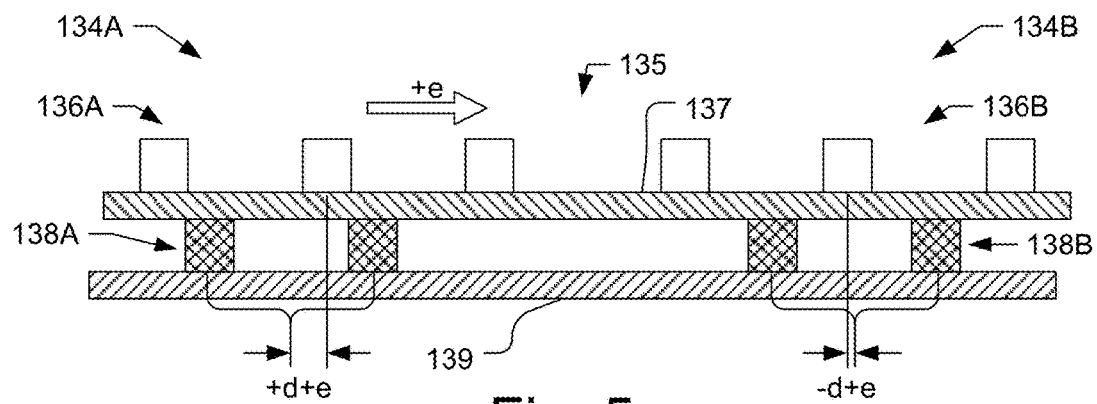
FIG. 5 illustrates overlay measurement pads, similar to that shown in FIG. 3, but with an overlay error.

The presence of the different offsets ±d in the overlay measurement pads 134 produces different asymmetries in the overlay measurement pads 134, thus, knowledge of the size and direction of the offsets ±d permits calibration of the symmetry response to overlay error which can be used to produce a properly dimensioned measurement of overlay error as discussed below. FIG. 5, by way of example, illustrates the overlay measurement pads 134A and 134B, similar to that shown in FIG. 3, but with an overlay error +e between the layers 137 and 139. Thus, the top grating 136A is shifted by +d+e from its nominal position with respect to the bottom grating 138A in overlay measurement pad 134A, while the top grating 136B is shifted by −d+e from its nominal position with respect to the bottom grating 138B in overlay measurement pad 134B, thereby producing different asymmetries in the overlay measurement pads 134A and 134B that may be imaged and used to determine the overlay error e by the metrology device 100.

In operation, the overlay target 132 may be imaged by the image based metrology device 100. A single image of the overlay target 132 may be used or individual images of each overlay measurement pad 134 may be used. The asymmetry of each overlay measurement pad 134 is measured. The change in the asymmetries measured in the x-axis and y-axis pairs of the overlay measurement pads as a function of the designed offset used in each pad may be used to produce a calibration of a symmetry response to overlay shift or for self-calibration to determine the overlay error. If desired, calibration of the symmetry response to overlay shift may be determined in other manners, e.g., using additional measurement pads or a theoretical analysis. The calibration for each measurement direction may then be applied to the measured asymmetries to one or both overlay measurement pads for the corresponding measurement direction to determine the overlay error.

One method for determining the asymmetry of the image is to calculate the difference in the image intensity at equal distances about an estimated center position of the image. The displacement of the sample points is along the axis of the measurement. The differences at all points within an image region, which is preferably slightly larger than the dimension of the overlay measurement pad, are combined to produce a figure for the image asymmetry with the chosen estimated center position. The sum of the squares of the differences may be used to measure the asymmetry, but other methods of combining the individual differences are possible. The final value for the asymmetry in the image is obtained by finding the minimum value of the combined image intensity differences as the estimated center position is varied.

Figure 6:
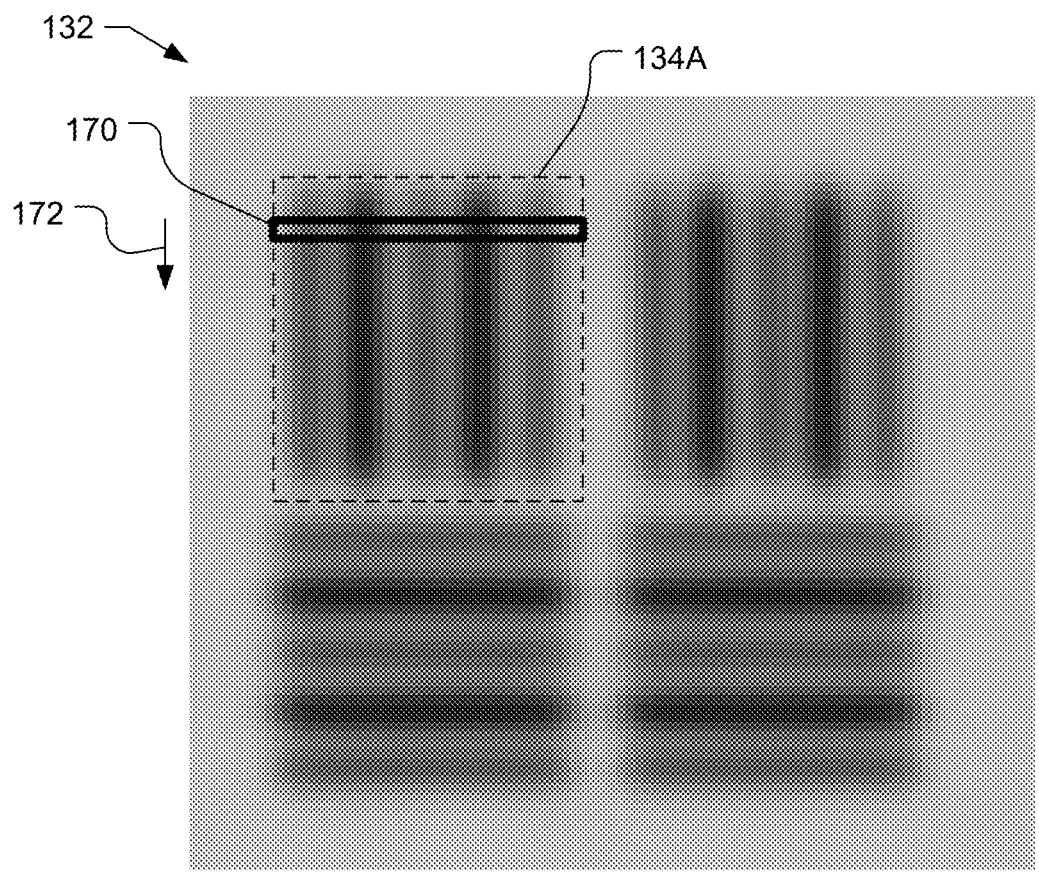
FIG. 6 illustrates an image of an overlay target with gratings.

FIG. 6, by way of example, illustrates an image of an overlay target 132. The asymmetry of each overlay measurement pad may be determined by dividing each overlay measurement pad into a series of scan lines (y), each running along the direction of the measurement axis. For example, FIG. 6 illustrates overlay measurement pad 134A with a single scan line 170 running in the direction of the measurement direction, i.e., the x axis. As illustrated by arrow 172, a number of scan lines at different positions will be applied to the overlay measurement pad 134. The number of scan lines may be equal to the number of rows of pixels in the direction perpendicular to the direction of measurement within the overlay measurement pad. As scan lines are used for the analysis, it should be clear that although the detection device in metrology device 100 is typically a two-dimensional camera, e.g., a CCD camera, other detection devices may also be used, for example, a single photo detector used with raster scanning laser light.

Figure 7:
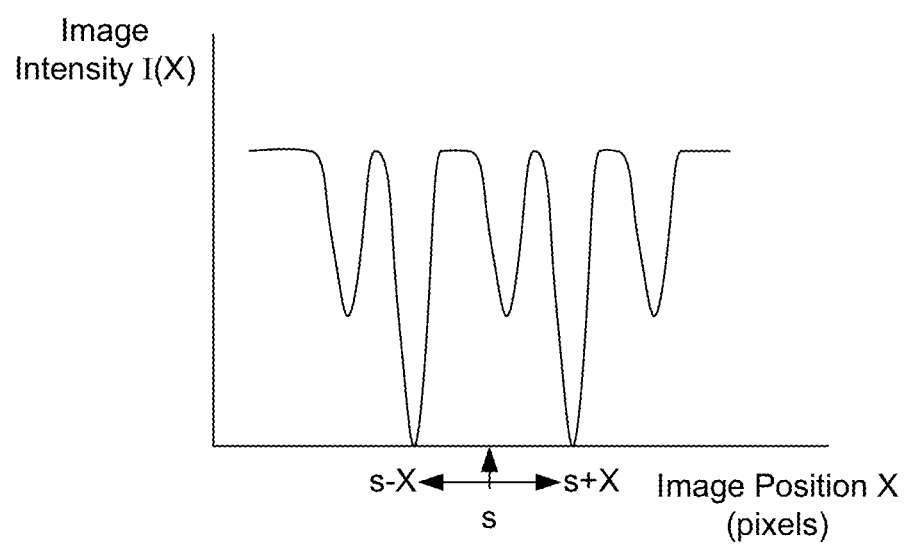
FIG. 7 illustrates the measured light intensity of an image of an overlay measurement pad across a scan line.

In each scan line, designated by (y), an initial candidate center point designated by (s) may be selected. The light intensity of the image across the scan line (y) is measured, as illustrated by FIG. 7. The measured light intensity on one side of the center point (s) is compared to the measured light intensity at a corresponding point on the other side of the center point. A calculation may then be performed indicating the degree of asymmetry f(s,y) in the image within the overlay measurement pad about the candidate center point (s). This procedure may be repeated for additional candidate center points on the scan line. For example, a next candidate center point may be selected by adding a positive or negative incremental value to the initial candidate center point. The candidate center point resulting in the minimum value for f(s,y) is taken as the actual center point, or the center of symmetry. The minimum value of f(s,y) is the point on the scan line having the highest degree of symmetry, i.e., where the measured light intensity profile along one side of the point (s) is most similar or symmetric to the measured light intensity profile along the other side of the point (s).

Calculating asymmetry can be performed in several ways. One way of performing it is from the sum of the square of the difference in intensity at all points the same distance either side of the point, via equation 1 below:

$$f(s, y) = \sqrt{\int_{-ROI}^{+ROI} (I(s + X, y) - I(s - X, y))^2 dX} \qquad \text{eq. 1}$$

where I is the image intensity, s is the center point, X is a distance (number of pixels) from the center point s, and the asymmetry value at a point s of scan line y is f(s,y), and ROI is the region of interest, i.e., the overlay measurement pad.

After an asymmetry value for substantially each scan line (y) is determined, the asymmetry values for each of the multiple scan lines may be combined in one of several different ways to derive a combined single asymmetry value for the overlay measurement pad. The asymmetry values for the scan lines may be averaged or combined in other ways. Averaging or otherwise combining values is advantageous as it improves the signal to noise ratio, but if desired, only a single scan line may be used. Another approach, instead of combining the asymmetry values, is to select a minimum asymmetry value from among all of the asymmetry values. Yet another approach is to choose a common center position for all scan lines and then to recalculate the asymmetry for each scan line using the common center position in place of s in Equation 1. Methods for calculating a common center position include, but are not limited to, using the average of the best center line position for all scan lines, or using the most frequent result. If desired, the intensity values at multiple points in the Y direction may instead be combined, and the asymmetry of the averaged signal calculated using the method explained above. It may also be advantageous to limit the extent of the region of interest in the direction perpendicular to the measurement direction so as to avoid the effect of the rounding at the ends of the line images in region 134A. Methods for limiting the region of interest include simple truncation at a point within the grating region, or weighting the calculations for each scan line by a factor that reduces sharply or steadily towards zero near the edge of the grating region.

Figure 8:
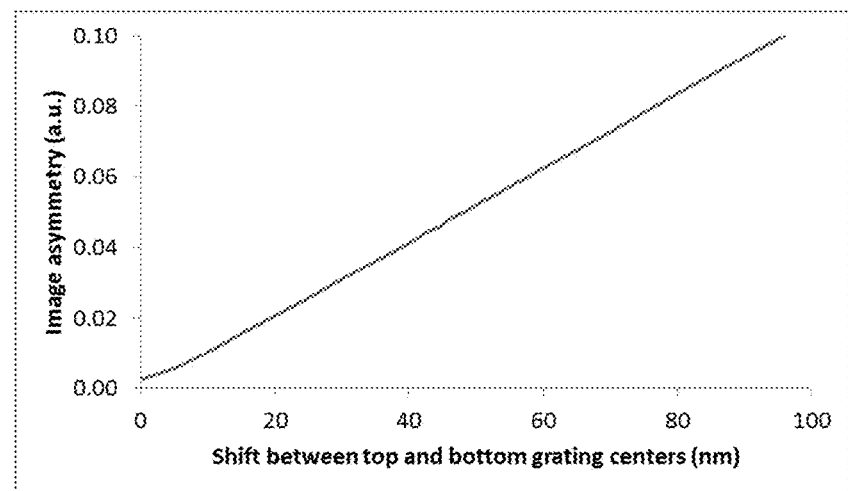
FIG. 8 is a graph illustrating the expected image asymmetry with respect to overlay shift.

Whichever method is used, the resulting asymmetry value may then be used to determine the target overlay error. By way of example, if the overlay target includes only a single overlay measurement pad for each measurement direction, the resulting single asymmetry value may be used to find overlay error using a theoretical model. For example, FIG. 8 illustrates a theoretical graph showing image asymmetry versus overlay shift for an overlay measurement pad with gratings having 1600 nm pitch and 100 nm CD. FIG. 8 shows that over useful ranges, overlay offset and modeled asymmetry are linear or nearly linear, and have a defined relationship. For the methods of calculating image asymmetry described above, the image asymmetry is the same for negative shifts as well as positive, although FIG. 8 does not show negative shifts. Thus, using a theoretical model, such as that shown in FIG. 8, the asymmetry value for the overlay measurement pad may be converted to an overlay error.

As can be seen in FIG. 8, the asymmetry response is nonlinear for shifts close to zero. It has been noted above that when the shift is zero the overlaid gratings form a symmetric pattern and hence the image asymmetry must also be zero. In practice any noise in the image will prevent a measurement of zero asymmetry. The nonlinear region in FIG. 8 near zero shift arises from simulated image noise, plus numerical limitations in the theoretical model and calculation of asymmetry, and discretization of the theoretical image onto a pixel array and does not contradict the knowledge that the target image is symmetric when the shift is zero, nor that the response shown in FIG. 8 will be the same for positive and negative shifts. Thus, the overlay measurement pad may include a designed in offset d so that the measurements will consistently be located on the linear section of the graph. In this region, image asymmetry A as a function of total shift S, is well described by the equation $$A = kS \qquad \text{eq. 2}$$

where k is the slope of the response, which could be predicted by modeling, but is generally unknown. Thus, k is one form of a calibration factor that describes the relationship between the asymmetry and the total shift S.

Accordingly, two overlay measurement pads per 134A and 134B may be used, with top and bottom gratings having different offsets from center alignment, e.g., ±5 nm, in order to avoid the nonlinear region, thereby allowing conversion of the asymmetry to overlay error and for the overlay sign to be determined. For example, the total shift $S_1$ and $S_2$ for the first overlay measurement pad 134A with offset $d_1$ and the second overlay measurement pad 134B with offset $d_2$ may be written as:

$$S_1 = d_1 + e$$

$$S_2 = d_2 + e. \qquad \text{eq. 3}$$

In the region where A=kS, the following relationships are found:

$$A_1 - A_2 = k(d_1 - d_2) \qquad \text{eq. 4}$$

$$k = \frac{A_1 - A_2}{d_1 - d_2}. \qquad \text{eq. 5}$$

From equation 3:

$$e = S_1 - d_1. \qquad \text{eq. 6}$$

From equation 2:

$$e = \frac{A_1}{k} - d_1. \qquad \text{eq. 7}$$

Substituting for k in equation 4:

$$e = \frac{A_1(d_1 - d_2)}{A_1 - A_2} - d_1. \quad \text{eq. 8}$$

Rearranging:

$$e = \frac{A_1 d_1 - A_1 d_2 - A_1 d_1 + A_2 d_1}{A_1 - A_2}. \quad \text{eq. 9}$$

Accordingly:

$$e = \frac{A_2 d_1 - A_1 d_2}{A_1 - A_2} \quad \text{eq. 10}$$

The offsets $d_1$ and $d_2$ in the overlay measurement pads 134A and 134B may be equal in magnitude but opposite sign, i.e., $d_1 = -d_2$, and thus the overlay error e in equation 10 may be written as:

$$e = \frac{d(A_1 + A_2)}{A_1 - A_2} \quad \text{eq. 11}$$

Thus, the overlay error may be determined, e.g., using an overlay target with a single overlay measurement pad per measurement direction by measuring the asymmetry of an overlay measurement pad and applying the calibration factor k, as shown in equation 2, which may be determined theoretically or provided from measurement of another overlay target having multiple overlay measurement pads, to determine the total shift S and removing the known offset d from the total shift S, e.g., from equation 6 to determine the overlay error e. Overlay error may also be determined with multiple overlay measurement pads using measured asymmetries $A_1$ and $A_2$ and offsets $d_1$ and $d_2$ to determine the calibration factor k, e.g., as illustrated in equation 5, which may be then be applied to the asymmetries $A_1$ and/or $A_2$ measured from one of the overlay measurement pads to derive the total shift S, from which the known offsets $d_1$ and/or $d_2$ may be removed, e.g., from equation 6 to determine the overlay error e. The determined calibration factor k may be provided for use with other overlay targets that use only a single overlay measurement pad per measurement direction. Additionally, a self-calibration procedure may be with multiple overlay measurement pads using measured asymmetries $A_1$ and $A_2$ and offsets $d_1$ and $d_2$ to directly determine the overlay error e, as described by equations 10 or 11, which is based, e.g., on the asymmetry response to overlay shift from equation 2. Thus, the overlay error e may be determined from the measured asymmetries $A_1$ and $A_2$ and offsets $d_1$ and $d_2$ using a difference between the asymmetries $A_1$ and $A_2$ or using regression analysis (linear or non-linear when additional overlay measurement pads are used) with the asymmetries $A_1$ and $A_2$. Additionally, it should be understood that different but mathematically equivalent calculations may be used to derive the overlay error e are possible and may be derived from the present disclosure by those of ordinary skill and are therefore contemplated as part of the present disclosure. With the use of addition overlay measurement pads similar derivations may be used to determine the overlay error e.

With the 800 nm pitch interleave design, it would be possible to pattern one overlay measurement pad with an offset of +20 nm from center alignment and the other overlay measurement pad with an offset of −20 nm from center alignment. Other values for the offset may be used and they need not be of opposite signs, i.e., directions. For example, the offsets between the top and bottom periodic patterns in the overlay measurement pads may be in the same direction, i.e., to the same side of center alignment. Additionally, more than two pads per measurement direction may be used if desired to improve measurement quality, although at the expense of increased total target size. One convenient method for using the asymmetry from two or more pads is to perform regression between the measured asymmetry and designed offset of each pad. If more than two pads are used then nonlinear regression is possible, which is advantageous if, for example, nonlinearity such as is seen near zero shift in FIG. 8 is likely to introduce appreciable error (e.g., in comparison with the tolerances of the process and the error budget allowed) into the measurement otherwise.

Figure 9:
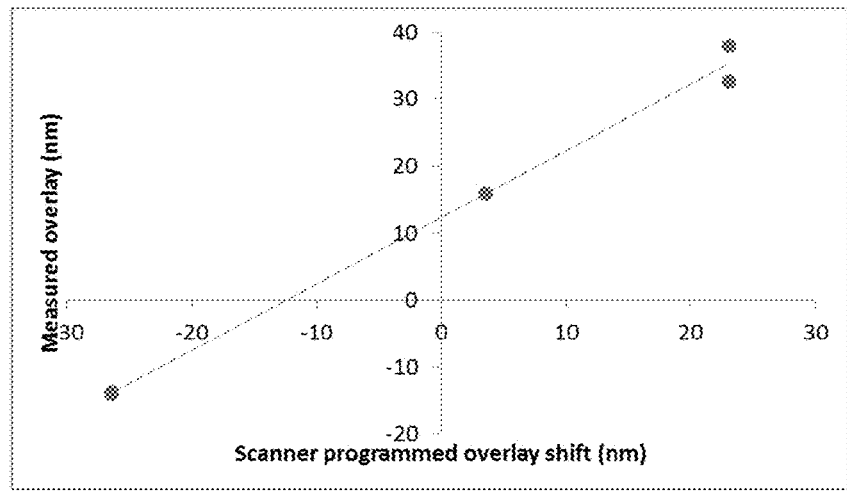
FIG. 9 is a graph illustrating measured overlay with respect to overlay shift that is programmed into overlay targets.

FIG. 9 illustrates experimental results for a four-pad overlay target (two pads per measurement direction) using 1600 nm grating pitch and 100 nm CD, and a 1 μm gap, as a function of deliberate overlay change. The measured overlay is plotted as a function of the expected overlay error, achieved by programming a scale error into the scanner. As can be seen in FIG. 9, the results are linear indicating that the process operates correctly. The curve in FIG. 9 does not pass through the origin (0,0) because of an inadvertent but constant overlay error of approximately 12 nm that was present in the sample in addition to the site to site intentional overlay variations.

Other manners of determining the overlay error are possible. For example, a mixture of overlay targets with multiple overlay measurement pads per measurement direction and those with one overlay measurement pad per measurement direction may be used. Calibration learned using the multiple overlay measurement pad targets may be applied to the measured asymmetry and designed grating offset for the single overlay measurement pad target. This technique reduces the average size of the overlay target and can be applied if any error arising from the assumption of constant calibration from one location on the wafer to another is small when compared with the error budget allowed for the measurement method. A further extension would be to determine the calibration using theoretical analysis such as image simulation or modeling, or experimentally from special calibration wafers where multi-pad targets were printed, and then use only targets with one pad per measurement direction when making measurements.

FIG. 10 illustrates a top view of another overlay target 132' which is similar to that shown in FIG. 2, but includes two additional overlay measurement pads 134B2 and 134D2. Overlay measurement pad 134B2 has a different offset between the top and bottom gratings than overlay measurement pads 134A and 134B. The overlay measurement pad 134B2 may be used along with overlay measurement pads 134A and 134B to determine overlay error, e.g., with a self-calibration procedure using a nonlinear regression analysis of the measured asymmetries from each overlay measurement pad 134A, 134B, and 134B2 or to determine a calibration factor for the symmetry response to overlay shift. Similarly, overlay measurement pad 134D2 has a different offset between the top and bottom gratings than overlay measurement pads 134C and 134D and may be used to determine the overlay error in a different measurement direction.

FIG. 11 illustrates a top view of another image based overlay target 190 with gratings that may be used with the image based metrology device 100 to determine overlay error of a sample. The overlay target 190 includes a two-dimensional top grating 192, i.e., the top grating 192 extends in two directions. The overlay target 190 further includes a two-dimensional bottom grating 194, which also extends in the two directions. The top grating 192 overlies the bottom grating 194 and may be offset by a known amount, as discussed above. If desired, overlay target 190 may include additional measurement pads, similar to that shown, but with different offsets between the top and bottom gratings. With the top and bottom gratings 192 and 194 being two-dimensional, the overlay target 190 may be used to determine the overlay error in two measurement directions. Thus, a first asymmetry a first measurement direction of the top and bottom gratings 192 and 194 in a first measurement direction may be measured and used to determine a first overlay error in a first measurement direction and a second asymmetry of the top and bottom grating 192 and 194 in a second direction that is orthogonal to the first measurement direction may be measured and used to determine a second overly error in the second measurement direction. If desired, additional overlay measurement pads with different offsets may be used with overlay target 190. Because overlay target 190 measures overlay error in two directions, the overlay target 190 (even with additional overlay measurements pads) may be more compact than the overlay target 132 shown in FIG. 2. However, there may be XY interactions in the image symmetry, and the pattern length is approximately half the pattern length of the one-dimensional overlay target 132, shown in FIG. 2.

Other overlay target designs may be used as well, where the lateral separation between the nearest lines from different layers is sufficiently small that proximity effects improve sensitivity of the measured asymmetry to overlay shift.

Figure 12:
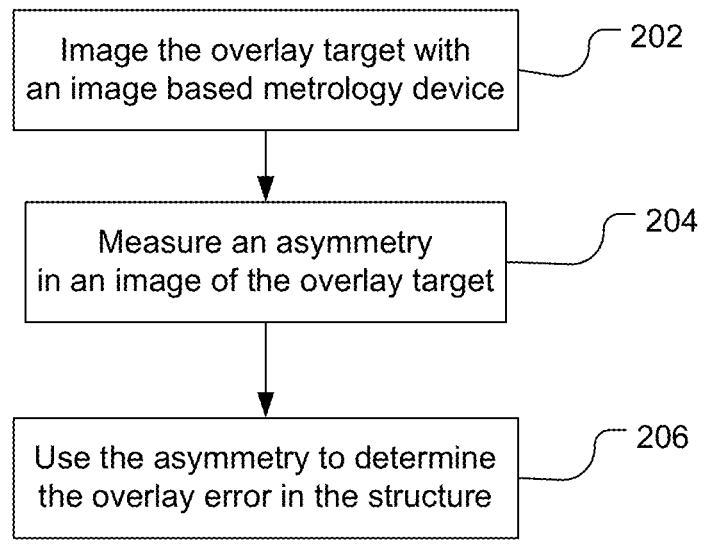
FIG. 12 is a flow chart illustrating a method of measuring an overlay error in a structure having an overlay target.

FIG. 12 is a flow chart illustrating a method of measuring an overlay error in a structure having an overlay target. As illustrated, the overlay target is imaged with an image based metrology device (202). The overlay target has a first top grating and a first bottom grating, wherein a nominal position of the first top grating with respect to the first bottom grating is the first top grating overlies the first bottom grating and is shifted with respect to the first bottom grating. In the nominal position, a lateral separation between a first line in the first top grating and a nearest second line in the first bottom grating may be less than five times an image resolution limit of the image based metrology device. The pitch and critical dimensions of the overlay target may be optimized to produce a greatest change of symmetry with overlay error for a numerical aperture and wavelength of light used by the image based metrology device. An asymmetry is measured in an image of the overlay target (204). For example, an intensity distribution in the overlay target, e.g., in a single overlay measurement pad, caused by the first top grating and the first bottom grating may be measured and the asymmetry determined using the asymmetry. The asymmetry may be used to determine the overlay error in the structure (206). For example, the asymmetry may be converted to the overlay error, e.g., using a calibration factor determined from a theoretical analysis or using a calibration factor determined from a different overlay target.

The overlay target may include multiple overlay measurement pads, e.g., a first overlay measurement pad and a second overlay measurement pad. The first overlay measurement pad having the first top grating and the first bottom grating. The second overlay measurement pad having a second top grating and a second bottom grating. A nominal position of the overlay target is a center of the first top grating is shifted with respect to a center of the first bottom grating by a first offset and a center of the second top grating is shifted with respect to a center of the second bottom grating by a second offset that is different than the first offset. The asymmetry in the image may be a first asymmetry in the first overlay measurement pad, wherein using the asymmetry to determine the overlay error may include measuring a second asymmetry in the second overlay measurement pad and using the first asymmetry, the first offset, the second asymmetry and second offset to determine the overlay error. For example, a calibration of asymmetry response to overlay shift may be produced using the first asymmetry, the first offset, the second asymmetry and second offset and the calibration applied to at least one of the first asymmetry and the second asymmetry to determine the overlay error. Another example includes self-calibrating using the first asymmetry, the first offset, the second asymmetry and second offset based on asymmetry response to overlay shift to calculate the overlay error. A difference between the first asymmetry and the second asymmetry or a regression analysis with the first asymmetry and the second asymmetry may be used to determine the overlay error. The regression analysis may be, e.g., a linear regression analysis or a non-linear regression analysis using additional asymmetry values measured from additional overlay measurement pads in the overlay target.

The overlay error determined using a first asymmetry in the first overlay measurement pad and a second asymmetry in the second overlay measurement pad may be for a first measurement direction. The overlay target may include a third overlay measurement pad and a fourth overlay measurement pad, where a second overly error is measured in a second measurement direction that is orthogonal to the first measurement direction using a third asymmetry in the third overlay measurement pad and a fourth asymmetry in the fourth overlay measurement pad.

Figure 13:
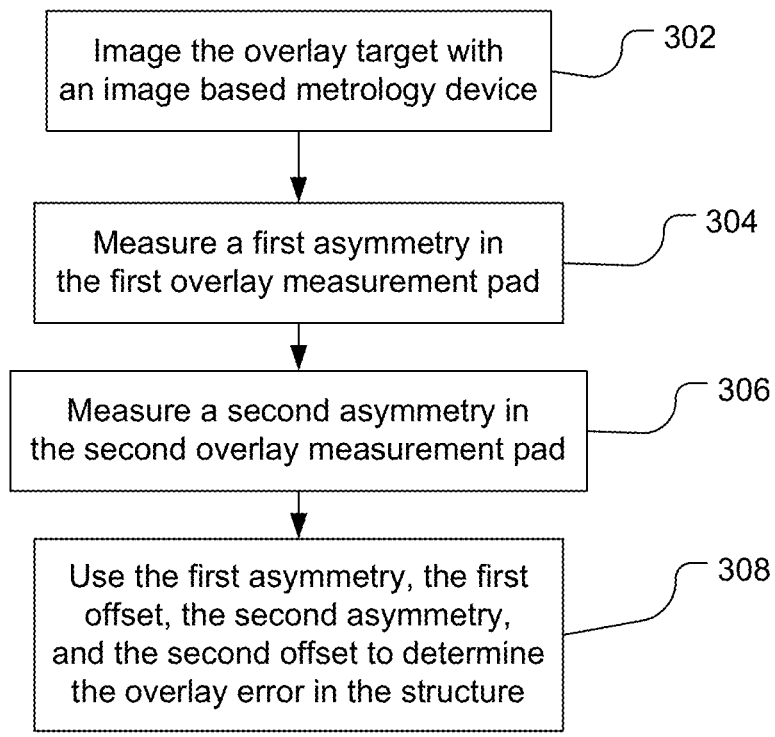
FIG. 13 is another flow chart illustrating another method of measuring an overlay error in a structure having an overlay target.

FIG. 13 is another flow chart illustrating another method of measuring an overlay error in a structure having an overlay target. As illustrated, the overlay target is imaged with an image based metrology device (302). The overlay target includes a first overlay measurement pad having a first top grating that overlies a first bottom grating, wherein a center of the first top grating is nominally shifted with respect to a center of the first bottom grating by a first offset. The overlay target further includes a second overlay measurement pad having a second top grating that overlies a second bottom grating, wherein a center of the second top grating is nominally shifted with respect to a center of the second bottom grating by a second offset that is different than the first offset. A first asymmetry in the first overlay measurement pad is measured from an image of the overlay target (304) and a second asymmetry in the second overlay measurement pad is measured from the image of the overlay target (306). The first asymmetry, the first offset, the second asymmetry, and the second offset are used to determine the overlay error in the structure (308). For example, the first asymmetry, the first offset, the second asymmetry, and the second offset may be used to produce a calibration of asymmetry response to overlay shift which is applied to at least one of the first asymmetry and the second asymmetry to determine the overlay error or for self-calibrating based on an asymmetry response to overlay shift to calculate the overlay error. The first asymmetry, the first offset, the second asymmetry, and the second offset may be used determine overlay error by using one of a difference between the first asymmetry and the second asymmetry and a regression analysis with the first asymmetry and the second asymmetry, wherein the regression analysis is one of a linear regression analysis and a non-linear regression analysis using a third asymmetry measured from a third overlay measurement pad in the overlay target. The determined overlay error may be for a first measurement direction, where a second overly error in a second measurement direction that is orthogonal to the first measurement direction may be determined using a third asymmetry in a third overlay measurement pad and a fourth asymmetry in a fourth overlay measurement pad that is present in the overlay target.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of measuring an overlay error in a structure having an overlay target, the method comprising:
   imaging the overlay target with an image based metrology device, the overlay target having at least one overlay measurement pad comprising a first top grating and a first bottom grating with lines of a same length, wherein a nominal position of the first top grating with respect to the first bottom grating is the first top grating overlies the first bottom grating and is shifted with respect to the first bottom grating, wherein a net pitch of the first top grating and the first bottom grating is above a resolution limit of the image based metrology device and lines in the first top grating and the first bottom grating are resolved in an image of the at least one overlay measurement pad in the overlay target produced by the image based metrology device to produce modulated intensity in the image of the at least one overlay measurement pad;
   determining a center of the at least one overlay measurement pad with the modulated intensity from the lines in the first top grating and the first bottom grating in the image of the at least one overlay measurement pad in the overlay target;
   measuring an asymmetry in the image of the at least one overlay measurement pad using the modulated intensity from the lines in the first top grating and the first bottom grating in the image with respect to the center of the at least one overlay measurement pad in the image of the at least one overlay measurement pad in the overlay target; and
   using the asymmetry to determine the overlay error in the structure.

2. The method of claim 1, wherein in the nominal position a lateral separation between a first line in the first top grating and a nearest second line in the first bottom grating is less than five times an image resolution limit of the image based metrology device.

3. The method of claim 1, wherein the at least one overlay measurement pad comprises a first overlay measurement pad and a second overlay measurement pad, the first overlay measurement pad having the first top grating and the first bottom grating, the second overlay measurement pad having a second top grating and a second bottom grating, wherein a nominal position of the overlay target is a center of the first top grating is shifted with respect to a center of the first bottom grating by a first offset and a center of the second top grating is shifted with respect to a center of the second bottom grating by a second offset that is different than the first offset.

4. The method of claim 3, wherein the center of the at least one overlay measurement pad is the center of the first overlay measurement pad, and the asymmetry with respect to the center of the first overlay measurement pad in the image is a first asymmetry in the first overlay measurement pad, and wherein using the asymmetry to determine the overlay error comprises:
   determining a center of the second overlay measurement pad in the image;
   measuring a second asymmetry with respect to the center of the second overlay measurement pad in the image; and
   using the first asymmetry, the first offset, the second asymmetry and second offset to determine the overlay error.

5. The method of claim 4, wherein using the first asymmetry, the first offset, the second asymmetry and second offset to determine the overlay error comprises:
   producing a calibration of asymmetry response to overlay shift using the first asymmetry, the first offset, the second asymmetry and second offset; and
   applying the calibration to at least one of the first asymmetry and the second asymmetry to determine the overlay error.

6. The method of claim 4, wherein using the first asymmetry, the first offset, the second asymmetry and second offset to determine the overlay error comprises:
   self-calibrating using the first asymmetry, the first offset, the second asymmetry and second offset based on asymmetry response to overlay shift to calculate the overlay error.

7. The method of claim 4, wherein using the first asymmetry, the first offset, the second asymmetry and second offset to determine the overlay error comprises using a difference between the first asymmetry and the second asymmetry or a regression analysis with the first asymmetry and the second asymmetry.

8. The method of claim 7, wherein using the regression analysis with the first asymmetry and the second asymmetry comprises a linear regression analysis or a non-linear regression analysis using additional asymmetry values measured from additional overlay measurement pads in the overlay target.

9. The method of claim 3, wherein the overlay error is in a first measurement direction and is determined using a first asymmetry with respect to the center of the first overlay measurement pad and a second asymmetry with respect to a center of the second overlay measurement pad, the overlay target further comprising a third overlay measurement pad and a fourth overlay measurement pad and the method further comprises measuring a second overlay error in a second measurement direction that is orthogonal to the first measurement direction using a third asymmetry with respect to a center of the third overlay measurement pad and a fourth asymmetry with respect to a center of the fourth overlay measurement pad.

10. The method of claim 3, wherein the first offset and the second offset are equal in magnitude but opposite in direction.

11. The method of claim 1, wherein the overlay error is in a first measurement direction and the asymmetry with respect to the center of the at least one measurement pad in the image is a first asymmetry of the first top grating and the first bottom grating in the first measurement direction, and the method further comprises measuring a second asymmetry of the first top grating and the first bottom grating with respect to a center of the at least one measurement pad in the image in a second direction that is orthogonal to the first measurement direction and using the second asymmetry to determine a second overlay error in the second measurement direction.

12. The method of claim 1, wherein using the asymmetry to determine the overlay error in the structure comprises converting the asymmetry to an overlay error using a calibration factor determined from a theoretical analysis.

13. The method of claim 1, wherein using the asymmetry to determine the overlay error in the structure comprises converting the asymmetry to an overlay error using a calibration factor determined from a different overlay target.

14. The method of claim 1, wherein the first top grating has a same pitch as the first bottom grating.

15. The method of claim 1, wherein the first top grating is on a same plane as the first bottom grating.

16. The method of claim 1, wherein the first top grating is on a different plane than the first bottom grating.

17. The method of claim 1, wherein a pitch and critical dimensions of the overlay target are optimized to produce a greatest change of symmetry with overlay error for a numerical aperture and wavelength of light used by the image based metrology device.

18. An image based metrology device comprising:
an illumination source to produce illumination to be incident on an overlay target on a sample, the overlay target having at least one overlay measurement pad comprising a first top grating and a first bottom grating with lines of a same length, wherein a nominal position of the first top grating with respect to the first bottom grating is the first top grating overlies the first bottom grating and is shifted with respect to the first bottom grating, wherein a net pitch of the first top grating and the first bottom grating is above a resolution limit of the image based metrology device;
an imaging system to image the overlay target, wherein lines in the first top grating and the first bottom grating are resolved in an image of the at least one overlay measurement pad in the overlay target to produce modulated intensity in the image of the at least one overlay measurement pad; and
a processor coupled to receive the image of the overlay target from the imaging system, the processor configured to determine a center of the at least one overlay measurement pad with the modulated intensity from the lines in the first top grating and the first bottom grating in the image of the at least one overlay measurement pad in the overlay target, measure an asymmetry in the image of the at least one overlay measurement pad using the modulated intensity from the lines in the first top grating and the first bottom grating in the image with respect to the center of the at least one overlay measurement pad in the image of the at least one overlay measurement pad in the overlay target, and use the asymmetry to determine the overlay error in the sample.

19. The image based metrology device of claim 18, wherein the imaging system has an image solution limit and wherein the overlay target in the nominal position has a lateral separation between a first line in the first top grating and a nearest second line in the first bottom grating that is less than five times the image resolution limit.

20. The image based metrology device of claim 18, wherein the at least one overlay measurement pad comprises a first overlay measurement pad and a second overlay measurement pad, the first overlay measurement pad having the first top grating and the first bottom grating, the second overlay measurement pad having a second top grating and a second bottom grating, wherein a nominal position of the overlay target is a center of the first top grating is shifted with respect to a center of the first bottom grating by a first offset and a center of the second top grating is shifted with respect to a center of the second bottom grating by a second offset that is different than the first offset.

21. The image based metrology device of claim 20, wherein the center of the at least one overlay measurement pad is the center of the first overlay measurement pad, and the asymmetry with respect to the center of the first overlay measurement pad in the image is a first asymmetry in the first overlay measurement pad, and wherein the processor is configured to use the asymmetry to determine the overlay error by being configured to determine a center of the second overlay measurement pad in the image, measure a second asymmetry with respect to the center of the second overlay measurement pad in the image, use the first asymmetry and the second asymmetry to use the first asymmetry, the first offset, the second asymmetry and second offset to determine the overlay error.

22. The image based metrology device of claim 21, wherein the processor is configured to use the first asymmetry, the first offset, the second asymmetry and second offset to determine the overlay error by being configured to use a difference between the first asymmetry and the second asymmetry or a regression analysis with the first asymmetry and the second asymmetry.

23. The image based metrology device of claim 22, wherein the processor is configured to use the regression analysis with the first asymmetry and the second asymmetry by being configured to use a linear regression analysis or a non-linear regression analysis with additional asymmetry values measured from additional overlay measurement pads in the overlay target.

24. The image based metrology device of claim 20, wherein the overlay error is in a first measurement direction and is determined using a first asymmetry with respect to the center of the first overlay measurement pad and a second asymmetry with respect to a center of the second overlay measurement pad, the overlay target further comprising a third overlay measurement pad and a fourth overlay measurement pad and the processor is further configured to measure a second overlay error in a second measurement direction that is orthogonal to the first measurement direction using a third asymmetry with respect to a center of the third overlay measurement pad and a fourth asymmetry with respect to a center of the fourth overlay measurement pad.

25. The image based metrology device of claim 20, wherein the first offset and the second offset are equal in magnitude but opposite in direction.

26. The image based metrology device of claim 18, wherein the overlay error is in a first measurement direction and the asymmetry with respect to the center of the at least one measurement pad in the image is a first asymmetry of the first top grating and the first bottom grating in the first measurement direction, and wherein the processor is further configured to measure a second asymmetry of the first top grating and the first bottom grating with respect to a center of the at least one measurement pad in the image in a second measurement direction that is orthogonal to the first measurement direction and use the second asymmetry to determine a second overlay error in the second measurement direction.

27. The image based metrology device of claim 18, wherein the processor is configured to use the asymmetry to determine the overlay error in the sample by being configured to convert the asymmetry to an overlay error using a calibration factor determined from a theoretical analysis.

28. The image based metrology device of claim 18, wherein the processor is configured to use the asymmetry to determine the overlay error in the sample by being configured to convert the asymmetry to an overlay error using a calibration factor determined from a different overlay target.

29. The image based metrology device of claim 18, wherein the first top grating has a same pitch as the first bottom grating.

30. The image based metrology device of claim 18, wherein the first top grating is on a same plane as the first bottom grating.

31. The image based metrology device of claim 18, wherein the first top grating is on a different plane than the first bottom grating.

32. The image based metrology device of claim 18, wherein a pitch and critical dimensions of the overlay target are optimized to produce a greatest change of symmetry with overlay error for a numerical aperture of the imaging system and wavelength of light produced by the illumination source.

33. A method of measuring an overlay error in a structure having an overlay target, the method comprising:
    imaging the overlay target with an image based metrology device, the overlay target having a first overlay measurement pad having a first top gating that overlies a first bottom grating, the first top grating and the first bottom grating having lines of a same length, wherein a center of the first top grating is nominally shifted with respect to a center of the first bottom grating by a first offset and a net pitch of the first top grating and the first bottom grating is above a resolution limit of the image based metrology device, the overlay target further having a second overlay measurement pad having a second top grating that overlies a second bottom grating, wherein a center of the second top grating is nominally shifted with respect to a center of the second bottom grating by a second offset that is different than the first offset and a net pitch of the second top grating and the second bottom grating is above a resolution limit of the image based metrology device, wherein lines in the first top grating and the first bottom grating are resolved in an image of the overlay target produced by the image based metrology device to produce modulated intensity in the image of the first overlay measurement pad, and lines in the second top grating and the second bottom grating are resolved in the image of the overlay target produced by the image based metrology device to produce modulated intensity in the image of the second overlay measurement pad;
    determining a first center of the first overlay measurement pad with the modulated intensity from the lines in the first top grating and the first bottom grating in the image of the overlay target;
    determining a second center of the second overlay measurement pad with the modulated intensity from the lines in the second top grating and the second bottom grating in the image of the overlay target;
    measuring a first asymmetry in the image using the modulated intensity from the lines in the first top grating and the first bottom grating in the image with respect to the first center of the first overlay measurement pad in the image of the overlay target;
    measuring a second asymmetry in the image using the modulated intensity from the lines in the second top grating and the second bottom grating in the image with respect to the second center of the second overlay measurement pad in the image of the overlay target; and
    using the first asymmetry, the first offset, the second asymmetry, and the second offset to determine the overlay error in the structure.

34. The method of claim 33, wherein a lateral separation between a first line in the first top grating and a nearest second line in the first bottom grating is less than an image resolution limit of the image based metrology device causing proximity effects in the image of the overlay target.

35. The method of claim 33, wherein using the first asymmetry, the first offset, the second asymmetry, and the second offset to determine the overlay error in the structure comprises:
    producing a calibration of asymmetry response to overlay shift using the first asymmetry, the first offset, the second asymmetry and second offset; and
    applying the calibration to at least one of the first asymmetry and the second asymmetry to determine the overlay error.

36. The method of claim 33, wherein using the first asymmetry, the first offset, the second asymmetry and second offset to determine the overlay error comprises:
    self-calibrating using the first asymmetry, the first offset, the second asymmetry and second offset based on asymmetry response to overlay shift to calculate the overlay error.

37. The method of claim 33, wherein using the first asymmetry, the first offset, the second asymmetry and second offset to determine the overlay error comprises using a difference between the first asymmetry and the second asymmetry or a regression analysis with the first asymmetry and the second asymmetry.

38. The method of claim 37, wherein using the regression analysis with the first asymmetry and the second asymmetry comprises a linear regression analysis or a non-linear regression analysis using additional asymmetry values measured from additional overlay measurement pads in the overlay target.

39. The method of claim 33, wherein the overlay error is determined for a first measurement direction, the overlay target further comprising a third overlay measurement pad and a fourth overlay measurement pad and the method further comprises measuring a second overlay error in a second measurement direction that is orthogonal to the first measurement direction using a third asymmetry with respect to a center of the third overlay measurement pad and a fourth asymmetry with respect to a center of the fourth overlay measurement pad.

* * * * *

UNITED STATES PATENT AND TRADEMARK OFFICE
CERTIFICATE OF CORRECTION

PATENT NO. : 10,107,621 B2  
APPLICATION NO. : 13/766598  
DATED : October 23, 2018  
INVENTOR(S) : Nigel P. Smith Page 1 of 1

It is certified that error appears in the above-identified patent and that said Letters Patent is hereby corrected as shown below:

In the Claims

In Column 18, Line 2, in Claim 20, delete "haying" and insert --having--.

In Column 19, Line 31, in Claim 33, delete "gating" and insert --grating--.

Signed and Sealed this  
Third Day of December, 2019

Andrei Iancu  
*Director of the United States Patent and Trademark Office*